United States Patent [19]

Williams

[11] 4,314,376
[45] Feb. 2, 1982

[54] DOUBLE-SIDEBAND, SUPPRESSED-CARRIER, SIGNAL INJECTION APPARATUS FOR MUTING IN AN FM RECEIVER

[75] Inventor: Albert M. Williams, Los Angeles, Calif.

[73] Assignee: Westland International, Tarzana, Calif.

[21] Appl. No.: 140,252

[22] Filed: Apr. 14, 1980

[51] Int. Cl.³ .............................................. H04B 1/10
[52] U.S. Cl. ..................................... 455/212; 455/310
[58] Field of Search ............... 455/212, 213, 218, 222, 455/296, 310, 174, 194, 237

[56] References Cited

U.S. PATENT DOCUMENTS

| | | | |
|---|---|---|---|
| 2,395,737 | 2/1946 | Hansell | 455/212 |
| 2,398,793 | 4/1946 | Magnuski | 455/212 |
| 2,409,139 | 10/1946 | Magnuski | 455/212 |
| 2,462,224 | 2/1949 | Rheams | 451/296 |
| 2,525,359 | 10/1950 | Koch | 455/212 |
| 3,356,794 | 12/1967 | Felix | 455/310 |

Primary Examiner—Marc E. Bookbinder
Attorney, Agent, or Firm—Harvey S. Hertz

[57] ABSTRACT

A system for automatically adjusting the threshold sensitivity of an FM receiver (muting) to prevent noise capture and reduce the effects of distortion due to multipath reception. A crystal controlled oscillator drives a suppressed carrier modulator which in turn delivers sideband signals at F/88 and −F/88, where F is the IF center frequency of 10.7 MHz. The sidebands are injected into the FM receiver between the IF amplifier output and the input of a quadrature detector (discriminator) and fall outside of the maximum ± excursion of FM modulation within the IF bandpass, but are separated from F by less than the adjacent channel spacing. Proper adjustment of the level of these sidebands prevents noise capture and reduces FM Multipath Distortion.

10 Claims, 3 Drawing Figures

DOUBLE-SIDEBAND, SUPPRESSED-CARRIER, SIGNAL INJECTION APPARATUS FOR MUTING IN AN FM RECEIVER

BACKGROUND OF THE INVENTION

1. Field of the Invention

The invention relates generally to FM broadcase receivers and more particularly to noise muting circuits for such receivers.

2. Description of the Prior Art

In the prior art, various circuits have been used and proposed in efforts to mute or squelch noise in FM reception and prevent noise capture. The normal function of an FM receiver, through operation of its AFC and AVC circuits is to "lock" onto a received signal by adjusting its local oscillator frequency so that the received signal at IF will be centered within the IF pass band, and to hold a nominal overall gain. However, when no useful received signal is present or the receiver is detuned, "noise capture" can occur. This phenomenon is well understood by the skilled practitioners in this art.

One prior art approach to the noise capture problem has been the introduction of a substitute signal, for example at the IF center frequency. Such a signal may or may not be gated in accordance with the presence or absence of bona fide receivable signals.

The concept of introducing a substitute muting or squelch signal for this or similar purposes is described in the technical and patent literature. U.S. Pat. Nos. 2,395,737 (Hansell), 2,462,224 (Rheams) and 2,409,139 (Magnuski) all show substitute signals from auxillary or muting oscillators.

It has been found that the introduction of a substitute signal either on a gated or continuous basis at the IF pass band center frequency produces mixing by-products which appear in the audio band as "birdies" or "whistles" and is therefore undesirable. Introduction of a substitute signal within the IF pass band, other than at band center has the additional disadvantage of causing the AFC circuits to detune the receiver in attempting to counteract for such an off-center substitute signal. Still further, the discrimination would be unbalanced by such a signal with probable distortion of the bona fide signal at one extreme of the FM excursion.

It is also known that noise capture of an FM receiver can be caused by short path reflected signals, i.e. signals arriving at the receiver only slightly later than a direct path reception from the same source, since these multipath signal components are essentially coherent and frequently comparable in strength to the direct path desired signal. Such multipath signals fall in the category of noise which can "capture" the FM receiver and confuse its AFC circuitry. This confusion of AFC results from assymmetrical discrimination output.

The manner in which the present invention overcomes the prior art disadvantage by providing a novel muting arrangement will be evident as this description proceeds.

SUMMARY OF THE INVENTION

In consideration of the problems of the prior art, it may be said to have been the general object of the invention to provide an injected substitute signal at a level sufficient to prevent noise capture without interference with the AFC and AVC circuits of the receiver.

To accomplish the general object, a suppressed-carrier, double-sideband signal is injected ahead of the discriminator, symmetrical about the center of the IF passband at a level just sufficient to give a desired level of muting but not sufficient to raise the threshold of sensitivity significantly. The double-sideband signal is always present, need not be gated, and does not interfere with FM modulation out to the maximum excursion because the injected sidebands are spaced outward (in frequency) beyond the nominal 75 KH$_z$ maximum FM excursion but nevertheless within the discriminator passband. More detail and an illustrative embodiment considered to be the best overall mode of practicing the invention will be described hereinafter.

DETAILED DESCRIPTION

Figure 1:
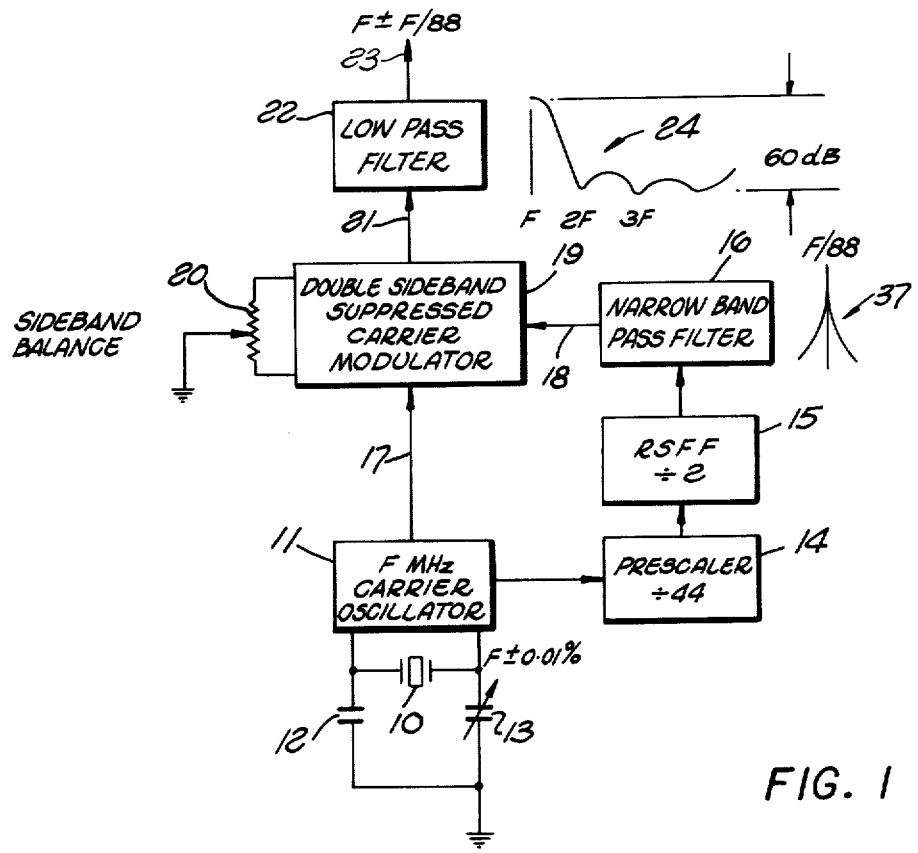
FIG. 1 is a schematic block diagram of the circuitry peculiar to the invention, to be included in a prior art FM receiver.

Referring now to FIG. 1, a typical arrangement for generation of the suppressed-carrier, double-sideband signal required to implement the invention is despicted. A carrier oscillator 11, crystal controlled, generates frequency F (center of the IF passband) using a conventional piezoelectric crystal 10. Trimmer capacitors 12 and 13 permit small modification of the frequency of osciallator 11 to within ±0.01% of F. A certain amount of precision of this frequency is desired so that, as will be seen later in this description, the sidebands generated as the end product of the FIG. 1 circuit will remain symmetrical about the IF passband center frequency F and also symmetrical about the discriminator cross-over point. The required precision is readily achieved in this art, and is several orders of magnitude less than required in a system which injects a single monochromatic signal at IF center as proposed in the prior art.

The oscillator 11 feeds a conventional, suppressed-carrier, modulator 19 having a typical adjustment 20 for equalizing the amplitudes of the two side bands at lead 21, via lead 17. The carrier F is substantially absent at 21, but harmonics do appear there due to the carrier, suppression characteristic of 19. Low pass filter 22 is designed to pass the two sidebands generated in 19 (F+F/88 and F−F/88) substantially equally but with attenuation approaching 60 db at 2F, 3F, etc. This characteristic is depicted graphically at 24 adjacent to filter 22 on FIG. 1. The main purpose of filter 22 is the suppression of incidental radiation in compliance with U.S. Federal Communication Commission applicable regulations.

Oscillator 11 also feeds a prescaler 14, to divide F by 44. Such elements as 14 are well known in the electronic arts and are available as solid-state integrated circuits elements, for example under the industry designation uPB551C. Feeding from prescaler 14, a reset/set flip-flop 15 provides additional division by 2, so that the output of 15 to narrow band pass filter 16 is F/88. Narrow passband filter 16 has a characteristic represented at 37 on FIG. 1, that is, filter 16 removes harmonics and provides an output at 18 which is very nearly monochromatic. From the foregoing, it will be seen that double-sideband, suppressed-carrier modulator 19 utilizes carrier input 17 and F/88 on input 18 as a modulation signal in generating the F±F/88 output at 23.

Figure 2:
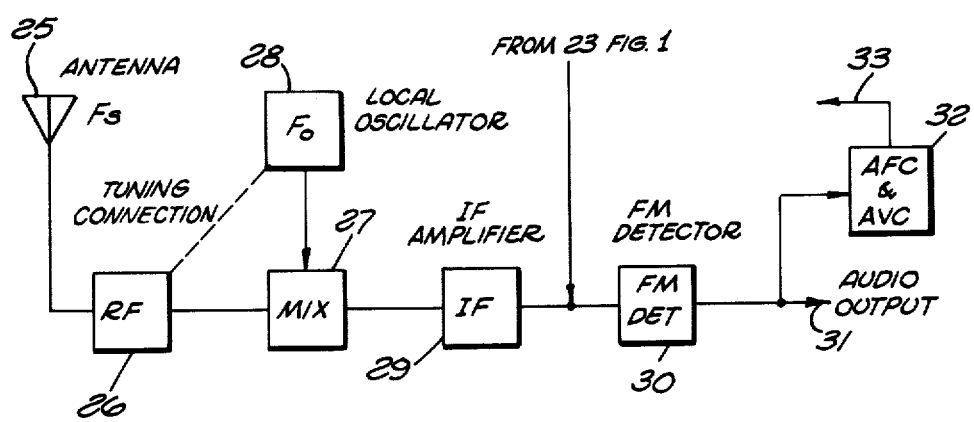
FIG. 2 is a schematic block diagram of a conventional FM receiver showing the point of injection of the signal from the apparatus of FIG. 1.

Referring now to FIG. 2, a schematic block diagram of a conventional FM receiver is depicted. Antenna 25 feeds received signals to RF amplifier stage 26. Local oscillator 28, feeding mixer 27 provides conventional superheterodyne conversion to the IF domain to provide a down-converted signal to IF amplifier 29. Local oscillator and RF stage 26 are tuned in synchronism by any well-known arrangement suitable for this purpose.

Figure 3:
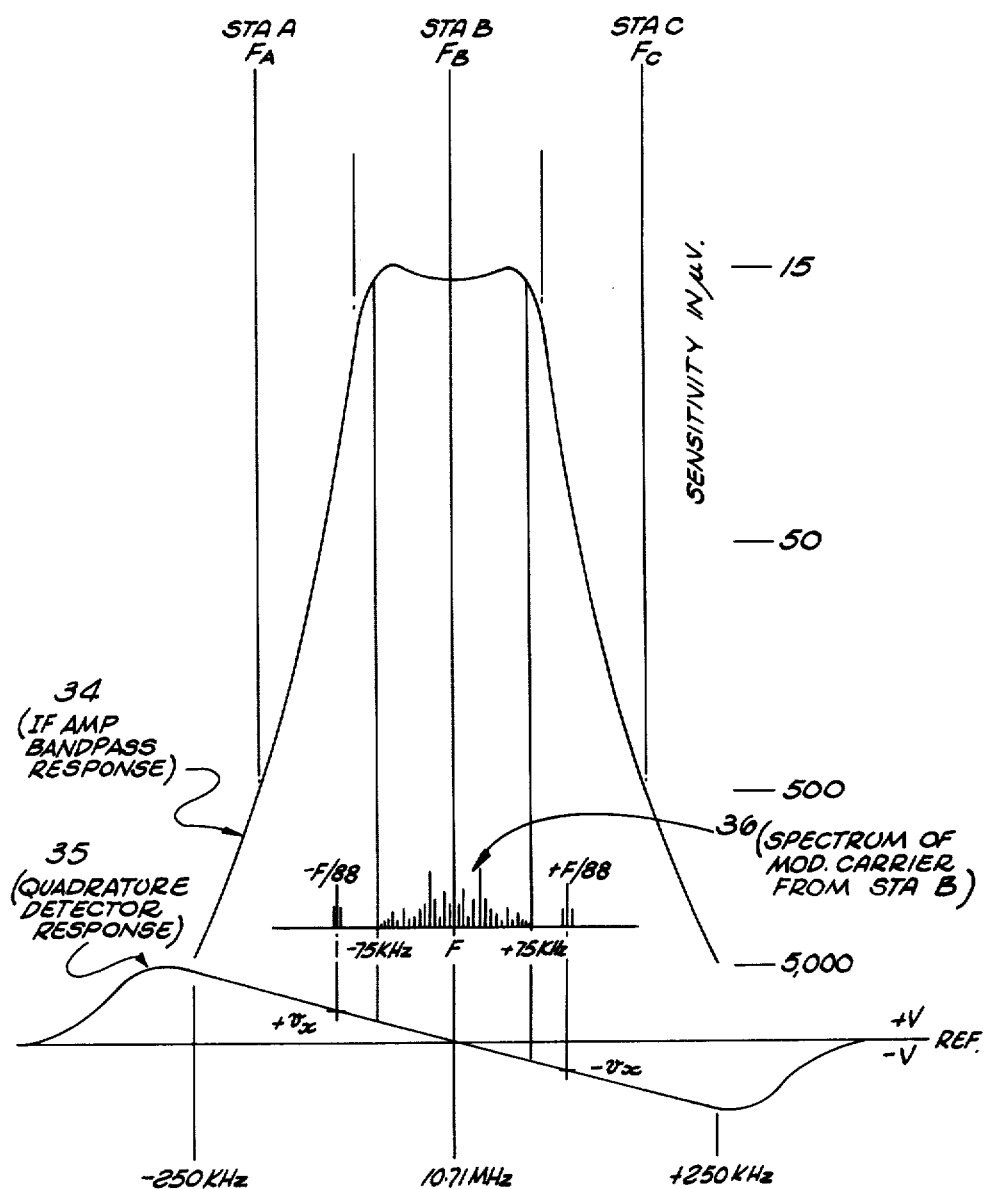
FIG. 3 is a graphical representation of the FM receiver IF bandwidth, a typical received signal spectrum, the discrimination characteristic and the spectra of the suppressed-carrier, double-sideband signal according to the invention.

The IF amplifier 29 has a pass-band center frequency of F, and at this point in the description, reference to FIG. 3 will be helpful. This IF passband is represented in FIG. 3 at 34, and F is the IF frequency assuming that the receiver is tuned to $F_B$ (station B), which may be assigned FM broadcast channel. The IF center frequency assumed is approximately 10.71 $MH_z$ and accordingly, the two injected side bands F±F/88 appear at 10.71 $MH_z$±121.7 $KH_z$. This figure of 121.7 $KH_z$ will be seen to be beyond the FM deviation of ±75 $KH_z$ depicted in connection with the typical received spectrum (at IF) identified at 36. As is conventional, the IF band pass characteristic 34 provides nearly maximum and approximately uniform sensitivity of 15 microvolts over the band 75 $KH_z$ on either side of F.

From FIG. 3 it can be estimated that the substitute signal consisting of F±F/88 falls along the steep IF passband skirts (curve 34), however this fact is of no consequence, since the injected signal does not pass through the IF amplifier. It is, of course not necessary that any IF amplification be provided at F±F/88, since these sidebands are locally generated at whatever level is required, and can be amplitude controllable if desired.

Below the IF response curve on FIG. 3 is the typical quadrature detector (discriminator) response of the discriminator 30 of FIG. 2. The cross over point falls at IF center frequency F and the side bands generated at 23 in FIG. 1 are injected at the input to discriminator 30 as indicated on FIG. 2.

From FIG. 3, it will be evident that the injected sidebands produce $+V_x$ and $-V_x$ discriminator responses, and these cancel at the discriminator output 31. Thus, while these sidebands provide an artificial capture effect, they do not operate to bias AFC or AVC circuits. Such circuits as may provide AFC and AVC are entirely conventional in the receiver employed and are represented by block 32 having an output 33. The output 33, if it is an AVC control signal (delayed or not) would be applied early in the circuit as a gain control signal—preferably to RF amplifier 26 to avoid saturation of subsequent circuits. AFC on the other hand is applied to the local osciallator, since its function is to automatically cancel tuning variations to keep the signal spectrum 36 centered as indicated in FIG. 3. The parameters represented in FIG. 3 presume the standard 200 $KH_z$ station spacing, i.e. broadcast station signals FA and $F_c$ are 200 $KH_z$ above and below $F_B$, respectively.

Slight asymmetry of the injection sidebands, provide the desired capture effect without nearly as much impact on discriminator balance as a single signal according to the prior art would have. However, provision has been made for precise balancing of the injected sidebands. Since these sidebands fall outside the normal limits of FM signal deviation, they need-not be gated and may be continuously present.

It will be realized that the level of the injected sidebands will be only that sufficient to mute noise so that the effect (raising) on the sensitivity threshold of the receiver will be minor.

From an understanding of the foregoing, it will be realized that the exact location of injection sidebands at ±F/88 is not required, however division by 88 is convenient and places the sidebands beyond the maximum FM deviation but still within the discriminator passband. These considerations are the criteria for placement of the injected sidebands.

Of course, the amplitude level of the injected sidebands can be made controllable. Normally, that level would be sufficient to mute noise, but not to significantly reduce the overall receiver sensitivity.

It will be realized that modifications of the apparatus disclosed are possible once the concepts of the invention are understood. Accordingly, it is not intended that the scope of the invention should be regarded as limited to the specific illustrations and description herewith.

I claim:

1. A muting device for an FM receiver having superheterodyne conversion means and an IF passband means at least sufficient to accommodate the maximum FM frequency excursion, comprising:
   an FM detector of the discriminator type coupled to said I.F. passband means and having a response characteristic which produces an output signal of one polarity responsive to a frequency input thereto on one side of the frequency corresponding to the center of said IF passband, and of the opposite polarity responsive to a frequency input thereto on the other side of said IF center frequency, said discriminator characteristic extending in frequency response on both sides of said frequency corresponding to said center of said IF passband; and
   first means for generating and injecting, in the signal path ahead of said discriminator, a suppressed-carrier, double-sideband signal which is symmetrical about said IF center frequency and of amplitude level sufficient to mute said receiver and prevent noise capture in the absence of a desired received signal.

2. Apparatus according to claim 1 in which said double-sidebands are placed at IF frequencies spaced greater than the maximum frequency excursion of said desired received signal at IF but less than the limits of said discriminator response characteristic on either side of said IF passband center.

3. Apparatus according to claim 1 in which said first means includes an accurately frequency-controlled oscillator providing a signal at said IF passband center frequency, and a double-sideband, suppressed-carrier modulator responsive to said oscillator, and in which second means are included responsive to said oscillator for generating and applying to said modulator, a sideband spacing signal which is an integral submultiple of said IF passband center frequency, to generate said double sidebands.

4. Apparatus according to claim 2 in which said first means includes an accurately frequency-controlled oscillator providing a signal at said IF passband center frequency, and a double-sideband, suppressed-carrier modulator responsive to said oscillator, and in which second means are included responsive to said oscillator for generating and applying to said modulator, a sideband spacing signal which is an integral submultiple of said IF passband center frequency, to generate said double sidebands.

5. Apparatus accourding to claim 3 in which said integral submultiple is 1/88 of said IF passband center frequency.

6. Apparatus according to claim 3 in which said second means generate said submultiple such as to locate said double sidebands outside the maximum frequency excursion of said desired received signal at IF.

7. Apparatus according to claim 6 in which said second means comprise a frequency dividing circuit responsive to said oscillator to produce said submultiple.

8. Apparatus according to claim 7 in which said frequency divider comprises a prescaler having a division ratio of 44 and a reset-set, flip-flop circuit responsive to said prescaler to provide an additional division by two, and in which a narrow band filter centered on said submultiple is connected to said flip-flop to provide said submultiple to said modulator substantially devoid of harmonic distortion.

9. Apparatus according to claim 1 in which said first means includes low-pass filter means for filtering said suppressed-carrier, double-sideband signal to suppress harmonic components in said signal.

10. Apparatus according to claim 8 in which said first means includes low-pass filter means for filtering said suppressed-carrier, double-sideband signal to suppress harmonic components in said signal.

* * * * *